United States Patent
Ting

(10) Patent No.: US 7,243,314 B2
(45) Date of Patent: Jul. 10, 2007

(54) WINDOW OPERATION INTERFACE FOR GRAPHICALLY REVISING ELECTRICAL CONSTRAINT SET AND METHOD OF USING THE SAME

(75) Inventor: Wei-Fan Ting, Taipei (TW)

(73) Assignee: Inventec Corporation, Taipei (TW)

( * ) Notice: Subject to any disclaimer, the term of this patent is extended or adjusted under 35 U.S.C. 154(b) by 157 days.

(21) Appl. No.: 11/105,515

(22) Filed: Apr. 14, 2005

(65) Prior Publication Data

US 2006/0236288 A1    Oct. 19, 2006

(51) Int. Cl.
*G06F 17/50*    (2006.01)
(52) U.S. Cl. .............................................. 716/2; 716/4
(58) Field of Classification Search ................ 716/1–2, 716/10–11, 4
See application file for complete search history.

(56) References Cited

U.S. PATENT DOCUMENTS

| | | | |
|---|---|---|---|
| 5,940,603 A * | 8/1999 | Huang | 716/5 |
| 7,047,168 B2 * | 5/2006 | Carballo et al. | 703/2 |
| 2003/0212980 A1 * | 11/2003 | Frank et al. | 716/18 |
| 2003/0237060 A1 * | 12/2003 | Satish et al. | 716/4 |
| 2004/0261047 A1 * | 12/2004 | Ashida et al. | 716/11 |
| 2005/0155006 A1 * | 7/2005 | Subasic et al. | 716/10 |
| 2006/0101368 A1 * | 5/2006 | Kesarwani et al. | 716/11 |

* cited by examiner

*Primary Examiner*—Paul Dinh
*Assistant Examiner*—Suresh Memula
(74) *Attorney, Agent, or Firm*—Rabin & Berdo, P.C.

(57) ABSTRACT

A window operation menu for graphically revising an electrical constraint set and a method of using the same. It may be used to graphically preview and revise the attribute contents of the electrical constraint set analyzed and exported by the wiring software, so that the batch revisions can be performed simultaneously for the attribute names of a plurality of electrical constraint sets, thus allowing the user to utilize the previously designed electrical constraint sets repeatedly. This achieves the purpose of saving the time and effort spent on the design and development of electronic products.

13 Claims, 4 Drawing Sheets

WINDOW OPERATION INTERFACE FOR GRAPHICALLY REVISING ELECTRICAL CONSTRAINT SET AND METHOD OF USING THE SAME

BACKGROUND OF THE INVENTION

1. Field of the Invention

The present invention relates to a window operation interface for graphically revising an electrical constraint set and a method of using the same, and in particular to a window operation interface for graphically revising the electrical constraint set by means of preview revision and batch/individual revision and a method of using the same.

2. Related Art

In recent years, due to the increasing complexity of the design of electronic products, the application and utilization of a convenient and powerful Electronic Design Automation (EDA) system has become increasingly important. At present, Cadence Design System Inc is one of the major suppliers of electronic design technologies, procedure planning and development, with its service and products covering the entire process flow of electronic product design. Among them, Allegro is a platform mainly used for the wiring layout design of the multi-layer printed circuit board (PCB). Allegro has become very popular and is widely used due to its benefits of easy utilization, easy modification, and high compatibility with other related software. Besides, it can be utilized by the user to develop related software according to his/her own actual requirements.

In the past, when designing a system, the hardware engineer is usually required to list the design requirements item-by-item, which are then given to the engineer of the multi-layer PCB for subsequent detailed designs. However, for the complicated electronic system with tens of thousands of wirings and restrictions, it is very difficult if not impossible to achieve complete and flawless management and implementation of the related designs. To overcome this problem and restriction, a build-in Constraint Manager (CM) is provided in Allegro that can be utilized by the design engineer to define the electrical constraint set (EC set) required, according to the relation and constraint between the wiring pattern and the signal wire length. As such, the electrical constraint set thus designed is used to enable the wiring software to automatically realize the wiring design. Thus, not only can time spent on the electronic product design be saved, but the probability of error can also be significantly reduced.

Since the above-mentioned electrical constraint sets may be exported as a distinct file having portable features, each of them can be utilized repeatedly. However, in utilizing the previously defined electrical constraint set, in order to revise some of the attributes or the previously defined names contained therein, the particular electrical constraint set needing revision must be searched through the numerous previously defined electrical constraint sets one-by-one by making use of the Constraint Manager. The electrical constraint set then has to go through the processes of opening, loading in, inspection, and the revision of the file. This process is tedious, time consuming and quite inconvenient for the repeated revisions required in the design of electronic products.

SUMMARY OF THE INVENTION

In view of the above-mentioned problems of the prior art, the object of the invention is to provide a window operation interface for graphically revising the electrical constraint set, and a method of using the same. The window operation interface may be a stand-alone type device operated independently of Allegro, which can be used to provide the listing of all the electrical constraint sets appearing in the directory. Besides, it is capable of displaying the contents of the selected electrical constraint set in a real time preview manner, thus enabling revision of the attributes concerned directly.

In addition to the ordinary naming rules used for naming the electrical constraint set, the invention provides a regular expression method for this purpose, which is used to select the electrical constraint set by searching through the file names, so that only the electrical constraint sets to be reused appear in the listing. Thus, the number of files remaining is reduced to facilitate inspection. In addition, the attributes of the filtered and selected electrical constraint sets can be revised in a batch manner.

Therefore, in order to achieve the above-mentioned purpose, the invention provides a window operation interface for graphically revising the electrical constraint set, comprising: a graphic operation interface, an input/output unit, a printout unit, a selection menu, an analysis unit, and a display unit.

The method for graphically revising the electrical constraint set disclosed by the invention may be conducted in a batch or an individual manner. When the objects to be revised exist only in a particular electrical constraint set, the individual revision mode is selected and utilized so that the topological structure in the electrical constraint set (namely, the connection relations between the elements) and the characteristic values of the elements can be displayed through the graphic interface to facilitate revision by the users; and when the objects to be revised exist simultaneously in a plurality of electrical constraint files, then the batch revision mode is utilized so as to save time spent on revision and improve revision efficiency.

The individual revision of the electrical constraint set according to the method of the invention comprises the following steps:

Firstly, reading in the directory containing the name of the electrical constraint set. Next, making a list of all the file names of the electrical constraint sets in the directory. Then, reading in a character string from the display screen as input by the user for selection, and selectively listing the file names of the electrical constraint sets real time, which is compatible with the input character string in the regular expression. Further, selecting the electrical constraint set for individual revision, of which the file name is taken from the listing and input by the user. Finally, upon finishing all the revisions, storing the electrical constraint set into the memory.

In addition, the batch revision mode of the electrical constraint set according to the method of the invention comprises the following steps:

Firstly, selecting the directory of the electrical constraint sets to be revised and utilized repeatedly. Next, making a list of the file names of the electrical constraint sets in the directory. Then, reading in a character string from the display screen as input by the user for filtering, and selectively listing the file names of the electrical constraint sets real time, which is compatible with the input character string in the regular expression. Subsequently, selecting one or more electrical constraint sets for batch revision, of which the file name(s) is/are taken from the listing and input by the user. Finally, upon finishing all the revisions, storing the plurality of electrical constraint sets in the memory.

Further scope of the applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given hereinbelow, which is for illustration only and thus is not limitative of the invention, and wherein.

DETAILED DESCRIPTION OF THE INVENTION

The purpose, construction, features, and functions of the invention can be appreciated and understood further through the following detailed description with reference to the attached drawings.

Figure 1:
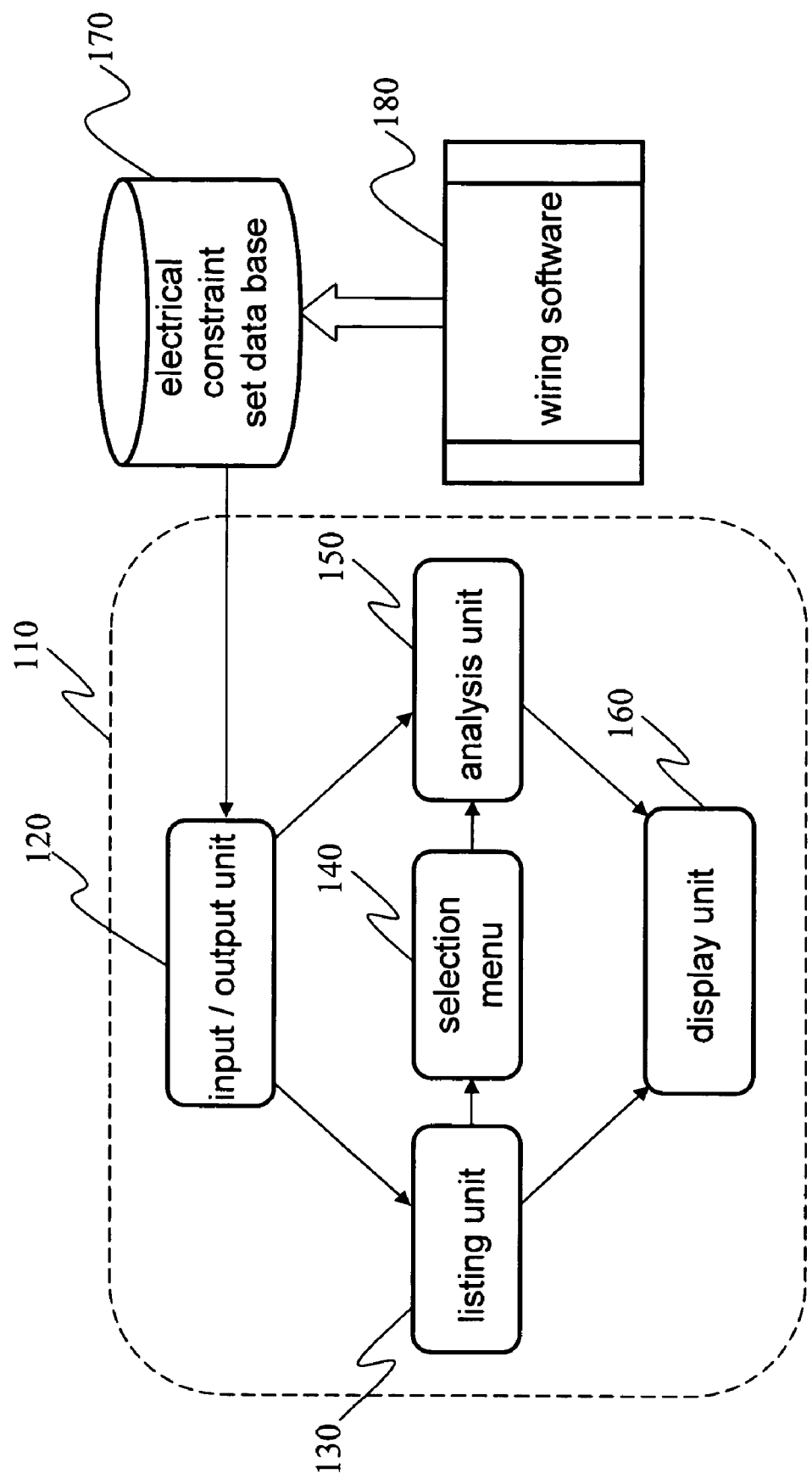
FIG. 1 is a system structure diagram of the window operation interface for graphically revising the electrical constraint set according to the embodiment of the invention.

Refer to FIG. 1 for the system structure diagram of the window operation interface for graphically revising the electrical constraint set according to the embodiment of the invention. As mentioned earlier, the limitation and shortcomings of the prior art are that the wiring software 180 cannot provide a convenient way of revising the previously designed electrical constraint set for repeated utilization so as to save the time and effort spent on the design and development of electronic products. To overcome the restrictions and shortcomings of the prior art, the window operation interface provided by the invention includes the following units.

A window operation interface 110 constituting the major outer appearance of the system, including an input unit 120 having a plurality of input fields, a listing unit 130 having a plurality of listing fields, a selection menu 140, and a display unit 150 having a plurality of display fields. When the user wishes to reuse the electrical constraint set exported by the wiring software 180, the directory storing the name of the electrical constraint set exported by the wiring software 180 can be input from the input field, the internal file name is indicated in the listing field, and the selection menu 140 is used to indicate the file name of the electrical constraint set selected by the user in the listing field. During the individual revision mode, the display field is used to display the attribute contents and the connection relations between attributes contained in the electrical constraint set; while in the batch revision mode, the selection menu 140 is used to indicate the electrical constraint set selected and its related attributes.

Furthermore, the input/output unit 120 is used to receive the respective electrical constraint sets exported by the wiring software 180 under the direction and operation of the user, and store the revised electrical constraint set and its file name back into the related memory and the directory after completion of revision. When the user selects from the input field the directory storing the file name of the electrical constraint set, the input/output unit receives the name of the directory as selected by the user, and utilizes it to retrieve the electrical constraint sets belonging to the directory from the electrical constraint set data base 170; and when the listing unit 130 is used to put the file names of these electrical constraint sets into the listing fields for listing, the listing unit is used to read the selection input into the listing filed by the user, and list the selected file names of the electrical constraint set in the selection menu 140; or, the listing unit 130 is used to read in the character string of the partial file name of the electrical constraint set to be searched when the user inputs the character string of the partial file name in regular expression for searching the electrical constraint file to be revised and reused.

When the previously designed electrical constraint set used for other design purposes is revised for the repeated utilization of the present design, the input/output unit 120 is used to store the file name of the newly revised electrical constraint set back to the directory upon completion of revision.

Besides, the listing unit 130 is used to make a listing of the file names of the respective electrical constraint sets, with the file name read from the input/output unit 120; a partial file name list is generated and displayed in the listing field, which is displayed in the selection menu 140 for the user's further selection when the file name string input by the user is in regular expression for searching the electrical constraint set to be revised.

The selection menu 140 is used to unable the user to make further selections regarding the filtered partial listing so that the objects of the batch revision can be more precise, thus saving time spent on retrieving the attributes of the electrical constraint set in the batch revision mode, and avoiding mistaken revision of the electric constraint set.

Furthermore, the analysis unit 150 is used to analyze the respective electrical constraint set coded in ASCII (American Standard Code for Information Interchange), and retrieve the plurality of attribute values and the mutual connection relations of the electrical constraint set according to the tag of the respective attribute field.

Lastly, the display unit 160 is utilized in the batch revision mode to display the selection menu 140 and the listings for all the attributes contained in the selected electrical constraint set when the user selects a plurality of electrical constraint sets in the selection menu. If the user makes the selection of only one electrical constraint set, then the display unit is used to display the attribute contents and the connection relations between them in the selected electrical constraint set.

Figure 2:
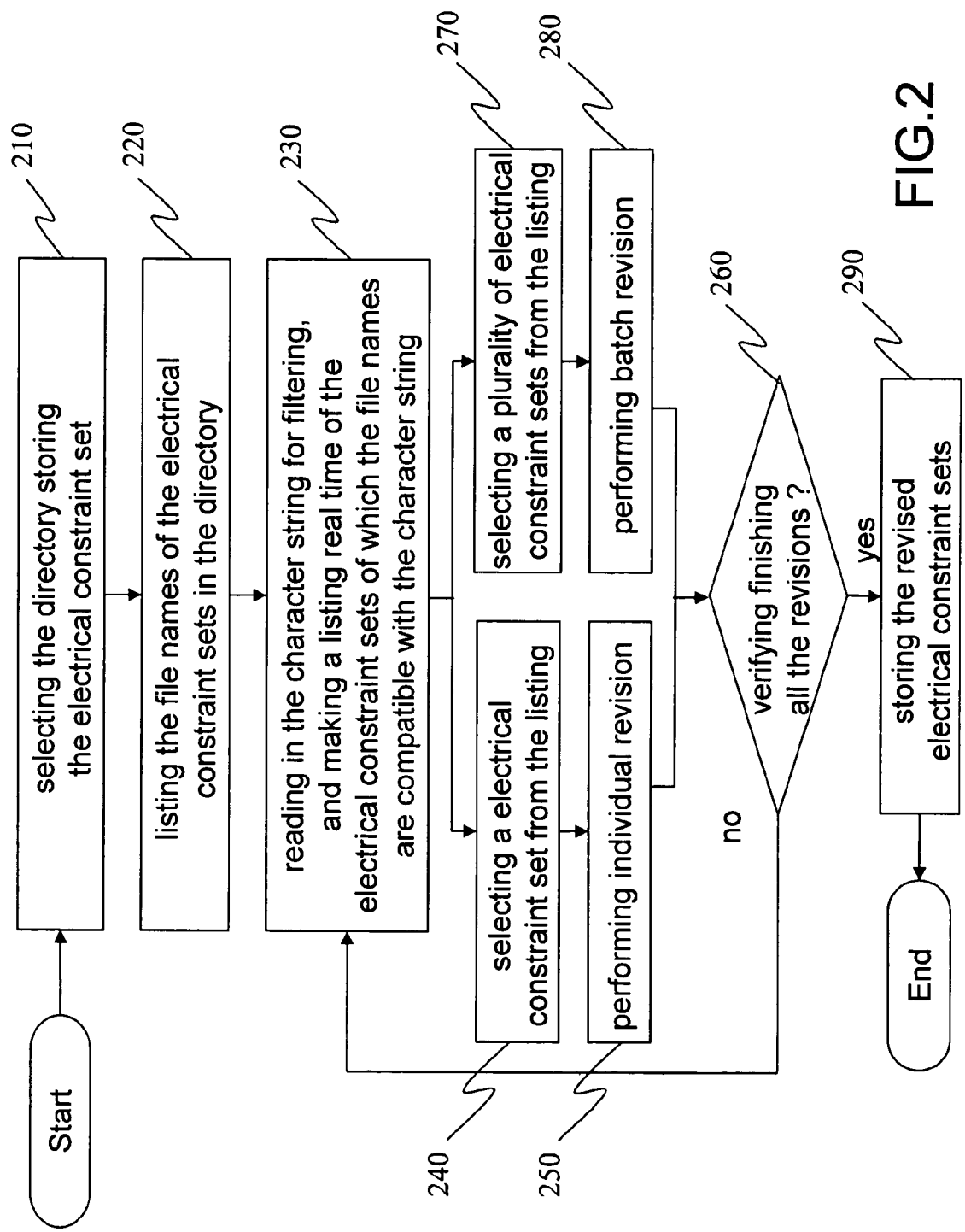
FIG. 2 is a flowchart of a method of utilizing the window operation interface for graphically revising the electrical constraint set according to the embodiment of the invention.

Now, refer to FIG. 2 for the flowchart of the method for graphically revising the electric constraint set according to the embodiment of the invention. To begin with, the user selects from the input field the directory storing the name of the electrical constraint set to be revised (step 210). Then, the input/output unit 120 is used to read and retrieve the electrical constraint set belonging to the directory from the electrical constraint set database 170 according to the received directory name, and the listing unit 130 is used to make a listing of these electrical constraint sets and display them in the listing fields (step 220).

There are various electrical constraint sets belonging to the directory, and due to the fact that each electrical constraint set includes the definitions of the attributes of the various circuits and the elements, the electrical constraint sets are preferably named according to this specific naming rules to define their pertinent file name, thus facilitating inspection and revision by the user.

As to the specific naming rule of the invention, by way of an example, assuming that the file name of the electrical constraint set is "PC-g13.top," from the former portion "PCI" of the file name it is known that this particular electrical constraint set is used to define the electrical restrictions for the internal insertion slots or the chips in the PCI bus.

With the implementation of this particular naming rule, the file names can be filtered and selected by making use of the regular expression method. For example, if the design of the PCI bus needs to be reutilized, then "PCI" is input to the listing field 130 so that a listing can be made real time for all the electrical constraints sets belonging to the directory having its file name containing PCI (namely, those electrical constraint set related to the PCI bus) so that only the electrical constraint sets of PCI bus to be reutilized are kept in the listing. Reduction in the number of the electrical constraint sets facilitates their inspection and revision by the user (step 230).

Figure 3:
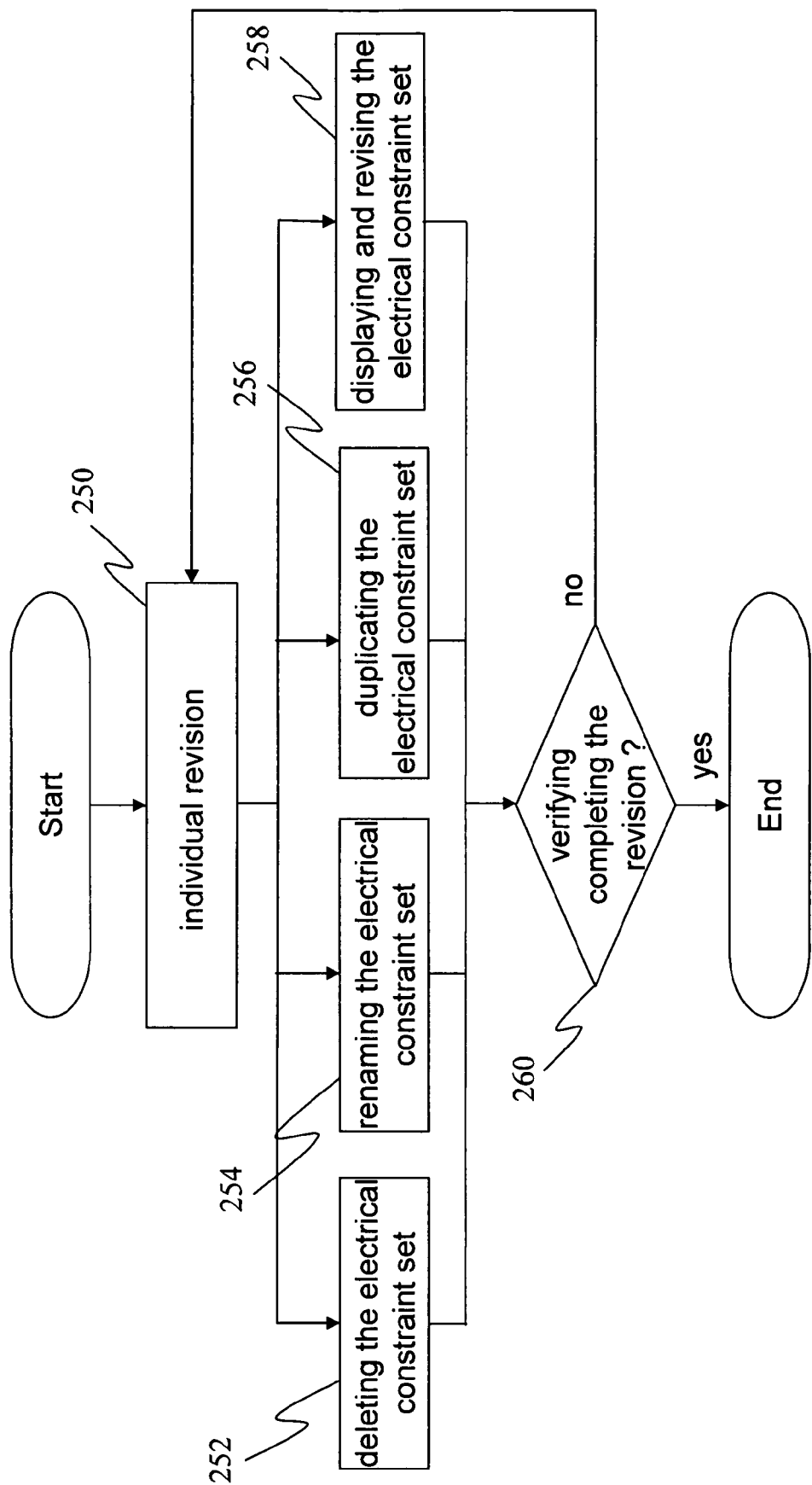
FIG. 3 is a flowchart of individual revision mode of the electrical constraint set according to the method the invention.

Next, referring to FIG. 3, when the user selects only one electrical constraint set from the listing (step 240), then individual revision is performed for the selected electrical constraint set (step 250), including: deleting the selected electrical constraint set (step 252), renaming the selected electrical constraint set (step 254), duplicating the selected electrical constraint set (step 256), displaying in the display fields the attribute contents and the connection relations between the various attributes, and directly selecting and revising the related attribute values (step 258).

Figure 4:
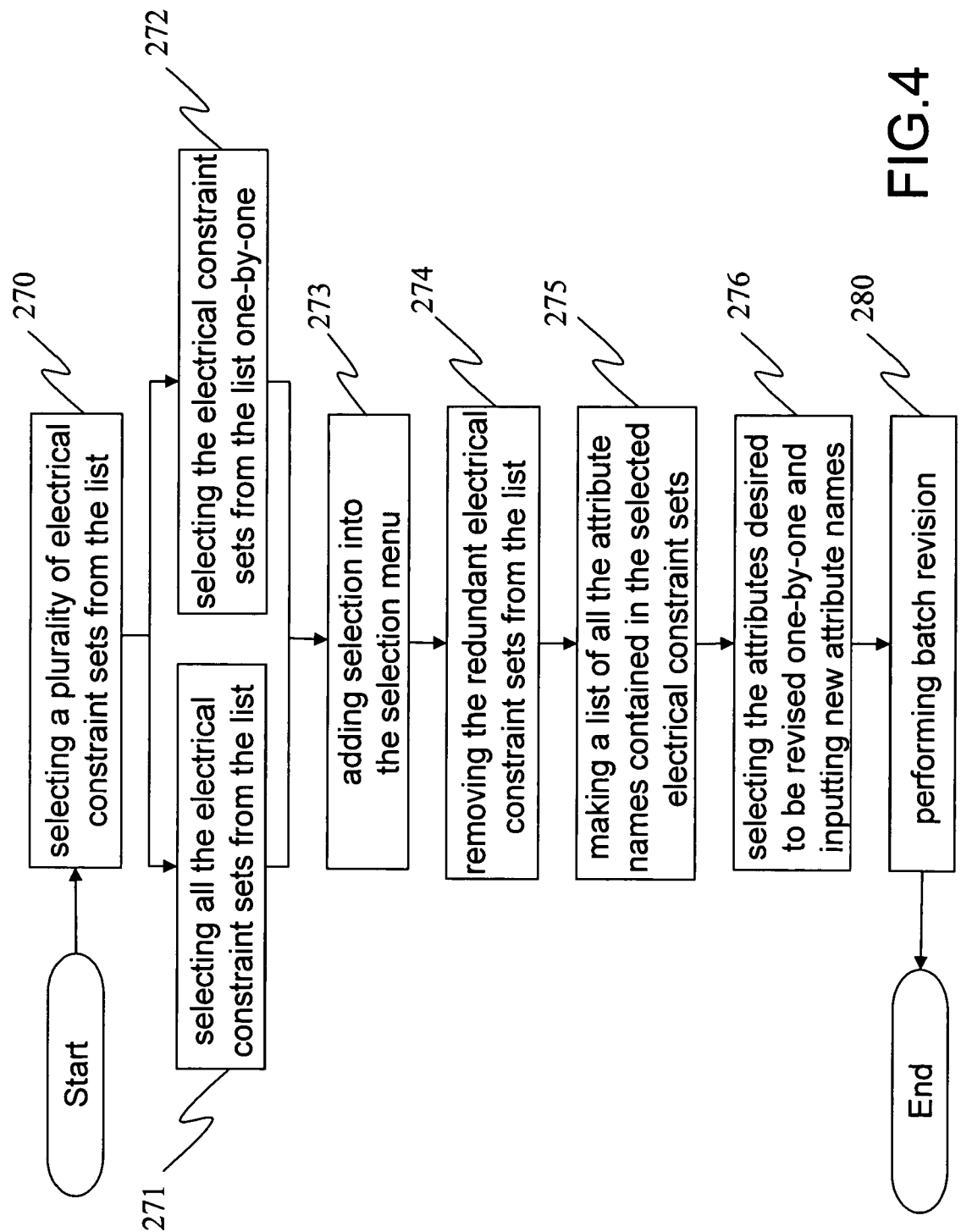
FIG. 4 is a flowchart of batch revision mode of the electrical constraint set according to the method the invention.

Furthermore, referring to FIG. 4, when a plurality of electrical constraint sets are selected from the listing (step 270), the user may select all the electrical constraint sets in the listing field (step 271), or may select the electrical constraint set to be revised from the listing field one-by-one (step 272); then, adding the selected electrical constraint sets to the selection menu 140 (step 273); if not all the electrical constraint sets in the selection menu 140 are to be revised, then removing the extra and redundant electrical constraint sets from the selection menu (step 274).

Upon analyzing the respective electrical constraint sets in ASCII (American Standard Code for Interchange) in the selection menu 140, make use of the analysis unit 150 to retrieve and list the attribute names and their restriction values contained therein (step 275); then, input the new attribute names depending on the actual requirements (step 276); next, upon finishing all the revisions of the attributes to be revised in the attribute listing, batch-revise the electrical constraint set contained in the selection menu 140 (step 280); subsequently, verify completion of the revision of all the electrical constraint sets to be revised (step 260); and finally, store all the revised electrical constraint sets into the related memory (step 290), thus completing the entire process of the revision of the electrical constraint sets.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A window operation interface for graphically revising electrical constraint sets, which is utilized to provide a graphic interface for facilitating a user to revise a first plurality of electrical constraint sets of a directory as exported by a wiring software in an individual revision or a batch revision mode, said window operation interface including:

an input/output unit, used to receive an operation direction given by the user and read the first plurality of electrical constraint sets, and store a file name of a revised electrical constraint set back to the directory, the first plurality of electrical constraint sets being coded in ASCII (American Standard Code for Information Interchange);

a listing unit, used to make a first listing of file names of the first plurality of electrical constraint sets, each of the file names containing at least a portion for defining a specific feature of each of the first plurality of electrical constraint sets, and generate a second listing of file names of a second plurality of electrical constraint sets whose file names contain a character string inputted by the user, each file name in the second listing being selected from the file names in the first listing;

a selection menu, used to show a third plurality of electrical constraint sets, each of which has a different file name, further selected by the user from the second listing for making a batch revision of the third plurality of electrical constraint sets;

an analysis unit, used to analyze the third plurality of electrical constraint sets, so as to retrieve attributes and connection relations among the attributes as contained in the third plurality of electrical constraint sets; and a display unit, used to display a listing of said attributes and the connection relations.

2. The window operation interface of claim 1, wherein said window operation interface enables the user to perform a browsing operation, a click and selection operation, a renaming operation, a reproducing operation, a revising operation, and a deleting operation upon the electrical constraint sets.

3. The window operation interface of claim 2, wherein the browsing operation enables the user to inspect the first and second listings.

4. The window operation interface of claim 2, wherein the click and selection operation enables the user to select the electrical constraint sets individually or as a group.

5. The window operation interface of claim 2, wherein the renaming operation enables the user to rename the file names of the third plurality of electrical constraint sets and/or names of the attributes contained therein.

6. The window operation interface of claim 1, wherein said input/output unit is responsive to an input of the directory thereto by the user, to read the directory into the interface.

7. The window operation interface of claim 1, wherein the selection menu enables the user to delete any duplicate or redundant electrical constraint sets from the third plurality of electrical constraint sets, as required.

8. The window operation interface of claim 1, wherein the selection menu appears in said window operation interface only in the batch revision mode.

9. The window operation interface of claim 1, wherein said display unit is used to make the listing of the attributes of the third plurality of electrical constraint sets in the batch revision mode by making use of the selection menu.

10. A method of utilizing a window operation interface for graphically revising a first plurality of electrical constraint sets, comprising the following steps:
- giving each of the first plurality of electrical constraint sets a file name that contains at least a portion for defining a specific feature of each of the first plurality of electrical constraint sets;
- reading a directory storing file names of the first plurality of electrical constraint sets;
- making a first listing of the file names of the first plurality of electrical constraint sets contained in the directory;
- reading into the interface a character string inputted by a user for filtering;
- selecting a second plurality of electrical constraint sets from the first plurality of electrical constraint sets;
- making a second listing of file names of the second plurality of; electrical constraint sets;
- selecting a electrical constraint set by the user from the second listing for to be revised;
- reading into the interface the file name of the selected electrical constraint set; and
- storing the selected electrical constraint sets back into the directory in a hard disk after completing the revisions.

11. The method of claim 10, wherein the revision further includes the following steps:
- deleting the selected electrical constraint sets;
- renaming said selected electrical constraint set;
- duplicating the selected electrical constraint set; and
- displaying contents of the selected electrical constraint set and making a revision of the contents.

12. A method of utilizing a window operation interface for graphically revising a first plurality of electrical constraint sets, comprising the following steps:
- giving each of the first plurality of electrical constraint sets a file name that contains at least a portion for defining a specific feature of each of the first plurality of electrical constraint sets;
- reading a directory storing file names of the first plurality of the electrical constraint sets;
- making a first listing of the file names of the first plurality of electrical constraint sets contained in the directory;
- reading into the interface a character string inputted by a user for filtering;
- selecting a second plurality of electrical constraint sets from the first plurality of electrical constraint sets;
- making a second listing of file names of the second plurality of electrical constraint sets whose file names contain the character string;
- selecting by the user a third plurality of electrical constraint sets from the second plurality of electrical constraint sets;
- reading into the interface file names of the third plurality of electrical constraint sets;
- adding the third plurality of electrical constraint sets to a selection menu;
- making a batch revision of the third plurality of electrical constraint sets; and
- storing the third plurality of electrical constraint sets back into memory after completing the batch revisions.

13. The method of claim 12, wherein:
- all of the second plurality of electrical constraint sets in the second listing are selected as the third plurality of electrical constraint sets, or the third plurality of electrical constraint sets are selected one-by-one from the second listing; and
- the batch revision further includes the following steps:
- adding the third plurality of electrical constraint sets to the selection menu
- removing duplicate and redundant electrical constraint sets selected by the user from selection menu;
- making a name listing of all attributes in the third plurality of electrical constraint sets, except the duplicate and redundant ones, as selected from the selection menu; and
- selecting attributes desired to be revised one-by-one and making a revisions required.

* * * * *